(12) United States Patent
Shin (10) Patent No.: US 8,953,408 B2
(45) Date of Patent: Feb. 10, 2015

(54) SEMICONDUCTOR MEMORY DEVICE AND METHOD OF MANUFACTURING THE SAME

(71) Applicant: SK hynix Inc., Gyeonggi-do (KR)

(72) Inventor: Wan Cheul Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 183 days.

(21) Appl. No.: 13/718,911

(22) Filed: Dec. 18, 2012

(65) Prior Publication Data

US 2014/0064012 A1   Mar. 6, 2014

(30) Foreign Application Priority Data

Aug. 30, 2012   (KR) ........................ 10-2012-0095686

(51) Int. Cl.
| | | |
|---|---|---|
| *G11C 5/06* | (2006.01) | |
| *G11C 8/12* | (2006.01) | |
| *H01L 29/66* | (2006.01) | |
| *H01L 27/115* | (2006.01) | |

(52) U.S. Cl.
CPC ............ G11C 8/12 (2013.01); H01L 29/66477 (2013.01); H01L 27/11519 (2013.01); H01L 27/11524 (2013.01)
USPC ............ 365/230.06; 365/230.03; 365/185.17; 365/185.13; 365/185.11; 365/185.23; 257/E21.576; 438/622

(58) Field of Classification Search
CPC ...... G11C 8/12; G11C 16/0483; G11C 16/08; G11C 11/5628; H01L 29/66477
USPC ......... 365/230.03, 63; 438/622; 257/E21.576
See application file for complete search history.

(56) References Cited

U.S. PATENT DOCUMENTS

| | | | | |
|---|---|---|---|---|
| 7,161,842 B2* | 1/2007 | Park | .......................... | 365/185.33 |
| 2001/0030367 A1* | 10/2001 | Noguchi et al. | ............... | 257/758 |
| 2008/0198661 A1* | 8/2008 | Mokhlesi | .................. | 365/185.19 |
| 2011/0096600 A1* | 4/2011 | Noguchi | .................. | 365/185.05 |
| 2011/0149629 A1* | 6/2011 | Shim et al. | ....................... | 365/63 |

FOREIGN PATENT DOCUMENTS

KR   1020050061635   6/2005

* cited by examiner

*Primary Examiner* — Han Yang
*Assistant Examiner* — Xiaochun L Chen
(74) *Attorney, Agent, or Firm* — IP & T Group LLP (57) ABSTRACT

A semiconductor memory device includes a block decoder configured to output block selection signals for selecting memory blocks in response to a row address signal, a first memory block including a first drain select line, a first source select line, and a first word line group including a plurality of first word lines disposed between the first drain select line and the first source select line, the first memory block disposed between the block decoder and a first switching group, the first switching group configured to transmit first operating voltages to the first memory block in response to a first block selection signal among the block selection signals, and a first block word line configured to transmit the first block selection signal to the first switching group and disposed over the first memory block to avoid overlapping with the first word line group.

12 Claims, 6 Drawing Sheets

SEMICONDUCTOR MEMORY DEVICE AND METHOD OF MANUFACTURING THE SAME

CROSS-REFERENCE TO RELATED APPLICATION

This application claims priority to and the benefit of Korean Patent Application No. 10-2012-0095686, filed on Aug. 30, 2012, the disclosure of which is incorporated herein by reference in its entirety.

BACKGROUND

Exemplary embodiments of the present invention relate to a semiconductor memory device and a method of manufacturing the same. More specifically, the exemplary embodiments of the present invention relate to a semiconductor memory device including block word lines and a method of manufacturing the same.

DISCUSSION OF RELATED ART

A semiconductor memory device may include a cell array region and a peripheral region. Memory cells may be formed in a cell array region, and operating circuit groups configured to allow the memory cells to perform program, read, or erase operations may be formed in the peripheral region.

The memory cells disposed in the cell array region may be divided into a plurality of memory blocks.

The operating circuit groups may include a block decoder configured to output a block selection signal for selecting one of the memory blocks and a switching group configured to transmit operating voltages, which are applied to global lines in response to the block selection signal, to the memory block. The block selection signal may be applied from the block decoder through a block word line to the switching group.

The above-described switching group, block decoder, and block word line should be disposed to increase the integration density and performance of a semiconductor memory device.

SUMMARY OF THE INVENTION

Exemplary embodiments of the present invention are directed to a semiconductor memory device and a method of manufacturing the same, which may improve the integration density and performance of the semiconductor memory device.

One aspect of the exemplary embodiment of the present invention provides a semiconductor memory device including a block decoder configured to output block selection signals for selecting memory blocks in response to a row address signal, a first memory block including a first drain select line, a first source select line, and a first word line group including a plurality of first word lines disposed between the first drain select line and the first source select line, the first memory block disposed between the block decoder and a first switching group, the first switching group configured to transmit first operating voltages to the first memory block in response to a first block selection signal among the block selection signals, and a first block word line configured to transmit the first block selection signal to the first switching group and disposed over the first memory block to avoid overlapping with the first word line group.

Another aspect of the exemplary embodiment of the present invention provides a method of manufacturing a semiconductor memory device, including forming a drain select line, a source select line, and a word line group on a semiconductor substrate, the word line group including a plurality of word lines disposed between the drain select line and the source select line, forming a first interlayer insulating layer to cover the word line group, and forming a block word line over the first interlayer insulating layer to avoid overlap with the word line group.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Exemplary embodiments of the present invention will be described more fully hereinafter with reference to the accompanying drawings. This invention may, however, be embodied in different forms and should not be construed as limited to the embodiments set forth herein. Rather, these exemplary embodiments are provided so that this disclosure is thorough and complete and fully conveys the scope of the present invention to one skilled in the art. It should be readily understood that the meaning of "on" and 'over' in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something). In this specification, 'connected/coupled' represents that one component is directly coupled to another component or indirectly coupled through another component. In addition, a singular form may include a plural form as long as it is not specifically mentioned in a sentence.

Figure 1:
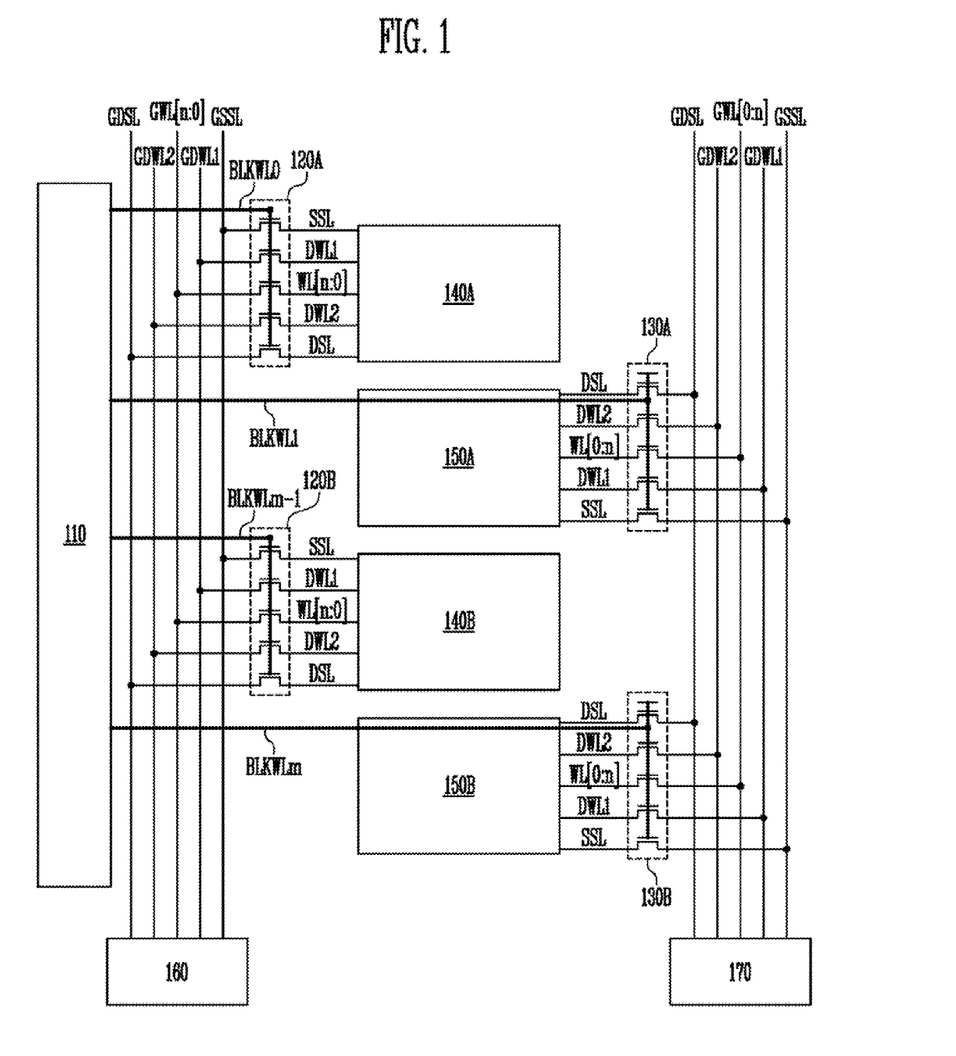
FIG. 1 is a diagram illustrating a semiconductor memory device according to a first exemplary embodiment of the present invention.

FIG. 1 is a diagram of a semiconductor memory device according to a first exemplary embodiment of the present invention.

Referring to FIG. 1, the semiconductor memory device may include a plurality of memory blocks 140A, 1408, 150A, and 15013, and operating circuit groups 110, 120A, 12013, 130A, 130B, 160, and 170.

Each of the memory blocks 140A, 140B, 150A and 150B may include a drain select line DSL, a source select line SSL, and a word line group WL[n:0] formed between the drain select line DSL and the source select line SSL. The word line group WL[n:0] may include a plurality of word lines. Drain select transistors may be connected to the drain select line DSL, source select transistors may be connected to the source select line SSL, and memory cells may be connected to word lines constituting the word line group WL[n:0], respectively. Each of the memory blocks 140A, 140B, 150A, and 150B may further include a first dummy word line DWL1 formed between the source select line SSL and the word line group WL[n:0], and a second dummy word line DWL2 formed between the drain select line DSL and the word line group WL[n:0]. Dummy memory cells may be connected to the first and second dummy word lines DWL1 and DWL2. The memory blocks 140A, 140B, 150A, and 150B may further include bit lines (refer to BL in FIG. 2) formed in a direction that crosses the drain select line DSL, the source select line SSL, and the word line group WL[n:0].

The memory blocks 140A, 140B, 150A, and 150B may include first memory blocks 150A and 150B and second memory blocks 140A and 140B disposed alternately. For example, the first memory blocks 150A and 150B may be even memory blocks, and the second memory blocks 140A and 140B may be odd memory blocks.

The operating circuit groups 110, 120A, 120B, 130A, 130B, 160, and 170 may include a block decoder 110, global line decoders 160 and 170, and switching groups 120A, 120B, 130A, and 130B. The block decoder 110 may output block selection signals for selecting one of the memory blocks 140A, 140B, 150A, and 150B to block word lines BLKWL0 to BLKWLm in response to row address signals. The global line decoders 160 and 170 may output operating voltages for programming, reading, or erasing memory cells to global line groups GSSL, GDWL1, GWL[n:0], GDWL2, and GDSL. The switching groups 120A, 120B, 130A, and 130B may connect the global line groups GSSL, GDWL1, GWL[n:0], GDWL2, and GDSL with the selected memory block in response to the block selection signals.

The switching groups 120A, 120B, 130A, and 130B may include first switching groups 130A and 130B and second switching groups 120A and 120B. The first memory blocks 150A and 150B are disposed between the block decoder 110 and the first switching groups 130A and 130B. The second switching groups 120A and 120B are disposed between the second memory blocks 140A and 140B and the block decoder 110. The global line groups GSSL, GDWL1, GWL[n:0], GDWL2, and GDSL may transmit the operating voltages for programming, reading, or erasing the memory cells. The global line groups GSSL, GDWL1, GWL[n:0], GDWL2, and GDSL may include first global line groups configured to transmit the operating voltages to the first switching groups 130A and 130B, and second global line groups configured to transmit the operating voltages to the second switching groups 120A and 120B.

The first switching groups 130A and 130B may include pass transistors configured to connect the first global line groups with the first memory blocks 150A and 150B in response to first block selection signals of the block selection signals. The second switching groups 120A and 120B may include pass transistors configured to connect the second global line groups with the second memory blocks 140A and 140B in response to second block selection signals of the block selection signals.

Operating voltages output from the global line decoder 160 and 170 may be transmitted to the switching groups 120A, 120B, 130A, and 130B through the first global line groups and the second global line groups. The global line decoders 160 and 170 may include a first global line decoder 170 configured to output operating voltages to the first global line groups, and a second global line decoder 160 configured to output operating voltages to the second global line groups.

Block selection signals output from the block decoder 110 may be transmitted to the switching groups 120A, 120B, 130A, and 130B through block word lines BLKWL0 to BLKWLm. The block word lines BLKWL0 to BLKWLm may include first block word lines BLKWL1 and BLKWLm configured to transmit the first block selection signals output from the block decoder 110 to the first switching groups 130A and 130B, and second block word lines BLKWL0 and BLKWLm−1 configured to transmit the second block selection signals output from the block decoder 110 to the second switching groups 120A and 120B.

To transmit the first block selection signals output from the block decoder 110 to the first switching groups 130A and 130B disposed opposite the block decoder 110, the first block word lines BLKWL1 and BLKWLm may be formed in a region in which the first memory blocks 150A and 150B are formed. Thus, since the first block word lines BLKWL1 and BLKWLm are disposed in the region in which the first memory blocks 150A and 150B are formed, according the first embodiment, it is unnecessary to prepare additional spaces where the first block word lines BLKWL1 and BLKWLm will be formed, at interfaces between the memory blocks 140A, 140B, 150A, and 150B. Thus, the first embodiment of the present invention provides a structure that may be advantageous for increasing the integration density of semiconductor memory devices.

In addition, in the first embodiment of the present invention, even if the block decoder 110 is not disposed adjacent to the first switching groups 130A and 130B, the block decoder 110 may be connected to the first switching groups 130A and 130B through the first block word lines BLKWL1 and BLKWm running across the region in which the first memory blocks 150A and 150B are formed. Thus, in the first embodiment of the present invention, first block selection signals may be transmitted from the block decoder 110 to the first switching groups 130A and 130B. Accordingly, in the first embodiment of the present invention, there is no need to form an additional block decoder configured to output the first block selection signals in a region adjacent to the first switching groups 130A and 130B. In the first embodiment, the block selection signals output from one block decoder 110 may be transmitted not only to the second switching groups 120A and 120B disposed adjacent to the block decoder 110 but also to the first switching groups 130A and 130B disposed apart from the block decoder 110. Thus, in the first embodiment, an area occupied by the block decoder 110 may be reduced so that the semiconductor memory device may be more highly integrated.

The first block word lines BLKWL1 and BLKWLm may be disposed in the region in which the first memory blocks 150A and 150B are formed so that the first block word lines BLKWL1 and BLKWLm do not overlap the word lines of the word line group WL[n:0] of the first memory blocks 150A and 150B. In the first embodiment, the first block word lines BLKWL1 and BLKWLm are formed not to overlap the word line group WL[n:0], thus, parasitic capacitance between the first block word lines BLKWL1 and BLKWLm and the word line group WL[n:0] may be reduced.

When the first block word lines BLKWL1 and BLKWLm overlap the word line group WL[n:0], a voltage of the word line group WL[n:0] may be changed under the interference of a voltage supplied to the first block word lines BLKWL1 and BLKWLm during operations of the memory cells. For example, a voltage supplied to word lines of a selected memory block may be boosted under the influence of a voltage applied to the block word line overlapping the word lines of the selected memory block during an erase operation, so a voltage difference between the word lines of the selected memory block and a substrate may be reduced. Thus, the selected memory block may not be erased. More specifically, during the erase operation, a ground voltage of, for example, about 0V, may be supplied to word lines of a selected memory block (e.g., 150A), and word lines of unselected memory blocks may be set to be floated. Also, when an erase voltage is supplied to the substrate (or a p-well), memory cells connected to the word lines of the selected memory block 150A may be erased due to a high voltage difference between the word lines of the selected memory block 150A and the substrate. However, when the first block word line BLKWL1 running over and across the selected memory block 150A overlaps the word lines, the voltage of the word lines of the selected memory block 150A may be boosted due to coupling capacitance caused by the voltage supplied to the first block word line BLKWL1. As a result, the voltage difference between the word lines of the selected memory block 150A and the substrate may be reduced, so the memory cells of the selected memory block 150A may not be erased. To prevent this phenomenon, in the first embodiment, the first block word lines BLKWL1 and BLKWLm may be formed to avoid overlap with the word line group WL[n:0].

Figure 2:
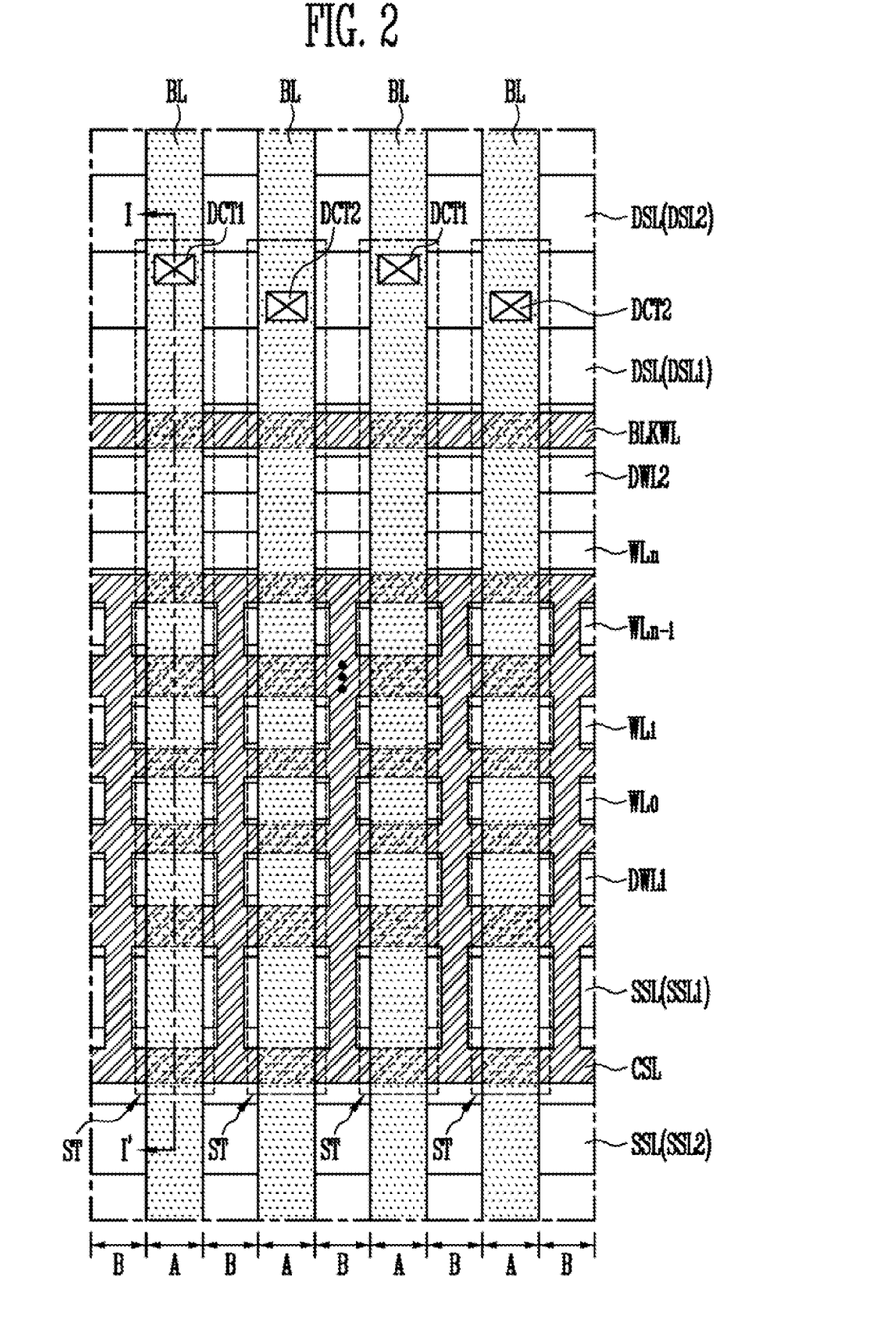
FIG. 2 is a plan view of a memory block shown in FIG. 1.
Figure 3:
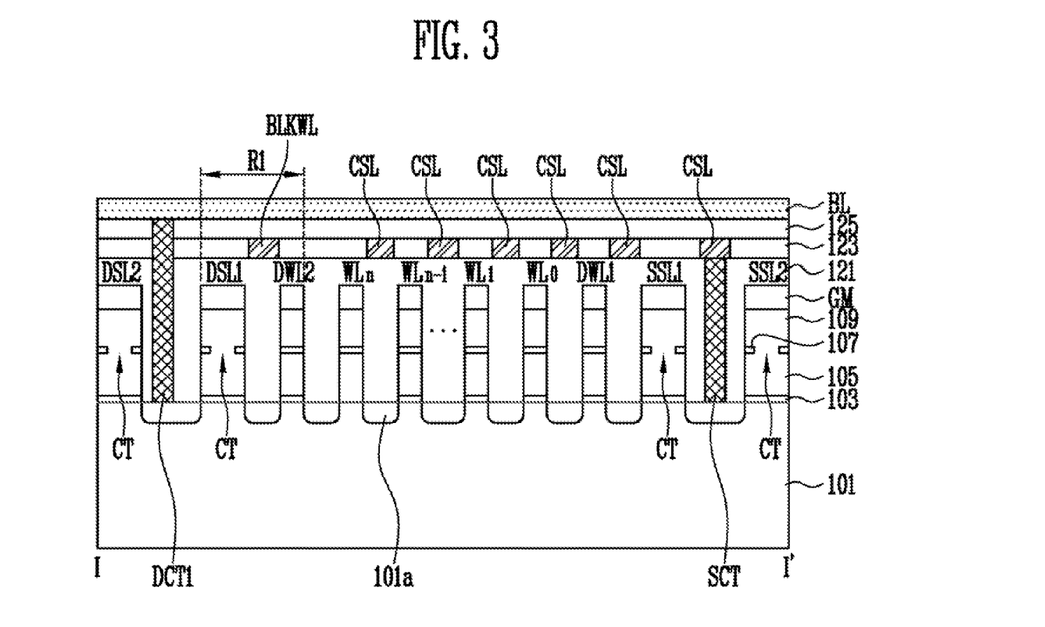
FIG. 3 is a cross-sectional view taken along line I-I' of FIG. 2.

FIG. 2 is a plan view of a memory block shown in FIG. 1, and FIG. 3 is a cross-sectional view taken along line I-I☐ shown in FIG. 2.

Referring to FIGS. 2 and 3, a first memory block of the semiconductor memory device may be formed on a semiconductor substrate 101 in which isolation regions B and active regions A are alternately defined. The active regions A may be regions partitioned by isolation trenches and an isolation layer formed in the isolation regions B. The first memory block may include a first drain select line DSL1, a first source select line SSL1, and a first word line group, which may be formed in a direction crossing the isolation regions B and the active regions A. The first word line group may include a plurality of first word lines WL0 to WLn disposed between the first drain select line DSL1 and the first source select line SSL1. The first memory block may further include a first dummy word line DWL1 formed between the first source select line SSL1 and the first word line group, and a second dummy word line DWL2 formed between the first drain select line DSL1 and the first word line group.

Drain select transistors may be formed at intersections between the first drain select line DSL1 and the active regions A, and source select transistors may be formed at intersections between the first source select line SSL1 and the active regions A. Memory cells may be formed at intersections between the first word lines WL0 to WLn and the active regions A, and dummy memory cells may be formed at intersections between the first and second dummy word lines DWL1 and DWL2 and the active regions A. Junction regions 101a may be formed by implanting impurities into the semiconductor substrate 101. A drain select transistor, a source select transistor, and memory cell transistors formed over each of the active regions A may be connected in series by the junction regions 101a and form a string structure ST.

A second drain select line DSL2 of a second memory block may be disposed adjacent to the first drain select line DSL1, and a second source select line SSL2 of another second memory block may be disposed adjacent to the first source select line SSL1. The first memory block may be disposed between the second memory blocks. Although not shown, each of the second memory blocks may include a second drain select line DSL2, a second source select line SSL2, and a second word line group disposed between the second drain select line DSL2 and the second source select line SSL2. The second word line group may include a plurality of second word lines.

Each of the junction regions 101a disposed between the first and second drain select lines DSL1 and DSL2 may be defined as a drain region of the string structure ST. Each of the junction regions 101a disposed between the first and second source select lines SSL1 and SSL2 may be defined as a source region of the string structure ST.

The drain select lines DSL, the source select lines SSL, the first word lines WL0 to WLn, the first and second dummy word lines DWL1 and DWL2, and the junction regions 101a may be covered with at least one first interlayer insulating layer 121. The first interlayer insulating layer 121 may be formed using a low-k dielectric layer having a lower dielectric constant than a silicon oxide layer to reduce interference between the first block word line BLKWL formed on the first interlayer insulating layer 121 and the first word line group formed under the first interlayer insulating layer 121. More specifically, the first interlayer insulating layer 121 may be formed using a low-k dielectric layer having a dielectric constant less than 4.0.

The first interlayer insulating layer 121 interposed between the first and second drain select lines DSL1 and DSL2 may be penetrated by drain contact plugs DCT1 and DCT2. The drain contact plugs DCT1 and DCT2 may include first drain contact plugs DCT1 and second drain contact plugs DCT2, which may be alternately disposed in a direction in which the first and second drain select lines DSL1 and DSL2 extend. The first drain contact plugs DCT1 and the second drain contact plugs DCT2 may be connected to the junction regions 101a formed in the active regions A. The first and second drain contact plugs DCT1 and DCT2 may be disposed in a zigzag pattern. Specifically, the first drain contact plugs DCT1 may be formed closer to the second drain select line DSL2 than to the first drain select line DSL1, and the second drain contact plugs DCT2 may be formed closer to the first drain select line DSL1 than to the second drain select line DSL2. Thus, a distance between the first and second drain contact plugs DCT1 and DCT2 may be maximized to thereby prevent electrical connections and interference between the first and second drain contact plugs DCT1 and DCT2. The first and second drain contact plugs DCT1 and DCT2 may protrude from the first interlayer insulating layer 121 and further penetrate second and third interlayer insulating layers 123 and 125 formed between the first interlayer insulating layer 121 and a bit line BL.

The first interlayer insulating layer 121 interposed between the first and second source select lines SSL1 and SSL2 may be penetrated by a source contact line SCT. The source contact line SCT may extend in the same direction as a direction in which the first and second source select lines SSL1 and SSL2 extend, and be connected in common to the junction regions 101a interposed between the first and second source select lines SSL1 and SSL2.

The second interlayer insulating layer 123 may be formed on the first interlayer insulating layer 121. The second interlayer insulating layer 123 may be penetrated by a common source line CSL and a first block word line BLKWL.

The common source line CSL may be formed to have a greater width than the source contact line SCT to penetrate the second interlayer insulating layer 123 disposed on the source contact line SCT. The common source line CSL may be formed as a mesh type to avoid overlaps with the first word lines WL0 to WLn, the first block word line BLKWL, and the first drain select line DSL1.

More specifically, to minimize parasitic capacitance between the first word line group and the first block word line BLKWL, the first block word line BLKWL may not overlap the first word lines WL0 to WL1. Also, the first word line BLKWL may be formed in a first edge region R1 of the first memory block, in which the first drain select line DSL1 and the second dummy word line DWL2 are formed. More specifically, the first block word line BLKWL may be disposed between the first drain select line DSL1 and the first word line group, or between the first drain select line DSL1 and the second dummy word line DWL2. A portion of the first block word line BLKWL may overlap the first drain select line DSL1 or the second dummy word line DWL2.

The third interlayer insulating layer 125 may be further formed on the second interlayer insulating layer 123, and bit lines BL may be formed on the third interlayer insulating layer 125. The bit lines BL may extend in the same direction as the active regions A and may overlap the active regions A. Each of the bit lines BL may be connected to the string structure ST through the corresponding one of the drain contact plugs DCT1 and DCT2.

Hereinafter, a method of manufacturing the semiconductor memory device according to the first embodiment of the present invention will be described.

In a NAND flash memory device, isolation layers may be formed in isolation regions B defined in a semiconductor substrate 101, and active regions A may be partitioned by the isolation layers in the semiconductor substrate 101. A tunnel insulating layer 103 and a first conductive layer 105 for a floating gate may be stacked on the active regions A. Thereafter, a dielectric layer 107 may be formed along the surface of the entire structure including the first conductive layer 105 and etched from a region where first and second drain select lines DSL1 and DSL2 and first and second source select lines SSL1 and SSL2 will be formed, thereby forming a contact hole CT. Thereafter, a second conductive layer 109 for a control gate may be formed on the entire structure having the contact hole CT, and gate mask patterns GM may be formed on the second conductive layer 109. Afterwards, the second conductive layer 109, the dielectric layer 107, and the first conductive layer 105 may be etched using the gate mask patterns GM as an etch barrier. In this case, the tunnel insulating layer 103 may be further etched. The first and second drain select lines DSL1 and DSL2, the first and second source select lines SSL1 and SSL2, the first word lines WL0 to WLn, and the first and second dummy word lines DWL1 and DWL2 may be formed using an etching process using the gate mask patterns GM as an etch barrier.

Subsequently, impurities may be implanted into the active regions A between the first and second drain select lines DSL1 and DSL2, between the first and second source select lines SSL1 and SSL2, between the first word lines WL0 to WLn, between the first dummy word line DWL1 and the first word line WL0, between the first dummy word line DWL1 and the first source select line SSL1, between the second dummy word line DWL2 and the first word line WLn, and between the second dummy word line DWL2 and the first drain select line DSL1, thereby forming junction regions 101a.

A first interlayer insulating layer 121 may be formed on the entire structure having the junction regions 101a. In this case, the first interlayer insulating layer 121 may be formed using a low-k dielectric layer having a dielectric constant of less than 4.0. Thus, even if the thickness of the first interlayer insulating layer 121 is not increased, parasitic capacitance between the first word line group and a first block word line BLKWL that may be formed on the first interlayer insulating layer 121, may be minimized. As the thickness of the first interlayer insulating layer 121 decreases, an aspect ratio of a contact hole formed through the first interlayer insulating layer 121 may be reduced during formation of the contact hole. Thus, process difficulties may be reduced to improve process stability.

After forming the first interlayer insulating layer 121, the first interlayer insulating layer 121 interposed between the first and second source select lines SSL1 and SSL2 may be etched to form a source contact trench, and the source contact trench may be filled with a conductive material to form a source contact line SCT.

Thereafter, a second interlayer insulating layer 123 may be formed on the entire structure having the source contact line SCT. After that, the second interlayer insulating layer 123 may be etched to form a common source line trench and a block word line trench disposed in a first edge region R1 of a first memory block. More specifically, the block word line trench may be disposed between the first drain select line DSL1 and the first word line group, or between the first drain select line DSL1 and the second dummy word line DWL2. A portion of the block word line trench may overlap the first drain select line DSL1 or the second dummy word line DWL2. Thereafter, the block word line trench and the common source lire trench may be filled with a conductive material to form the first block word line BLKWL and the common source line CSL.

A third interlayer insulating layer 125 may be formed on the entire structure including the first block word line BLKWL and the common source line CSL. Thereafter, drain contact holes may be formed through the third interlayer insulating layer 125, second interlayer insulating layer 123 and the first interlayer insulating layer 121 interposed between the first and second drain select lines DSL1 and DSL2, and expose the junction regions 101a. Next, the drain contact holes may be filled with a conductive material to form the drain contact plugs DCT1 and DCT2.

Thereafter, bit lines BL may be formed on the third interlayer insulating layer 125 and connected to the drain contact plugs DCT1 and DCT2.

Figure 4:
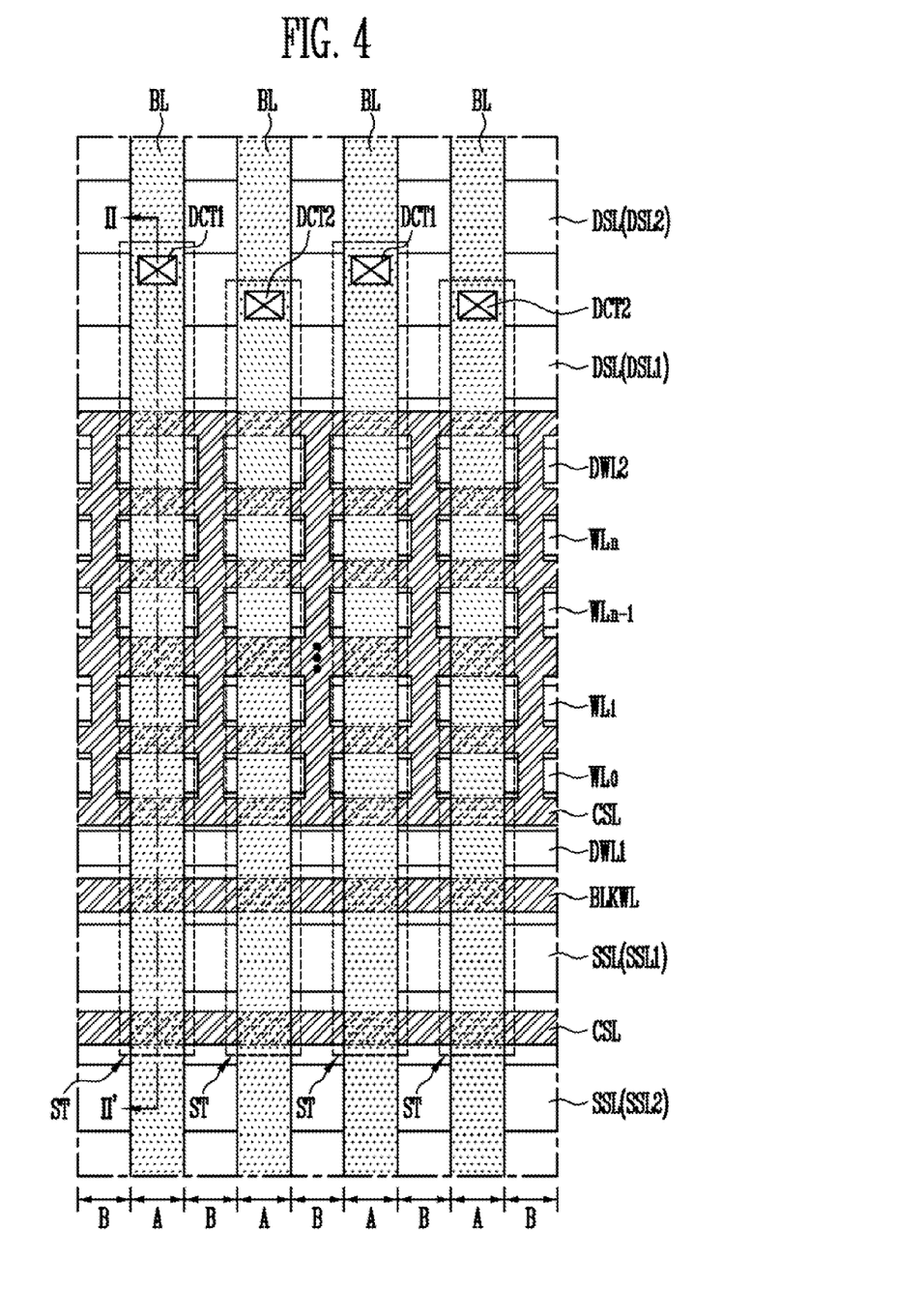
FIG. 4 is a plan view illustrating a memory block of a semiconductor memory device according to a second exemplary embodiment of the present invention.
Figure 5:
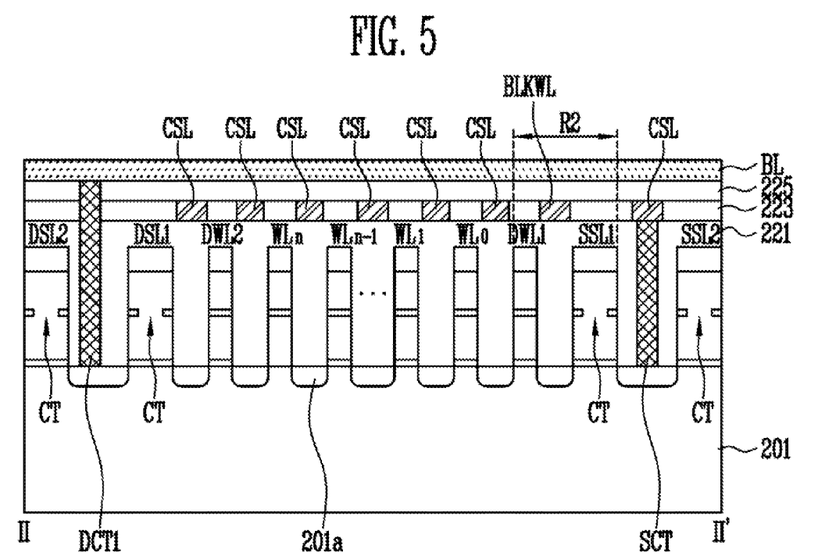
FIG. 5 is a cross-sectional view taken along line II-II' of FIG. 4.

FIG. 4 is a plan view illustrating a memory block of a semiconductor memory device according to a second exemplary embodiment of the present invention, and FIG. 5 is a cross-sectional view taken along line II-II' of FIG. 4. The second embodiment pertains to the same structure as in the first embodiment except for a region in which a first block word line BLKWL is formed.

Referring to FIGS. 4 and 5, a first memory block of a semiconductor memory device may be formed on a semiconductor substrate 201 on which isolation regions B and active regions A are alternately defined. The first memory block may include a first drain select line DSL1, a first source select line SSL1, and a first word line group. The first word line group may include a plurality of first word lines WL0 to WLn. The first memory block may further include a first dummy word line DWL1 formed between the first source select line SSL1 and the first word line group, and a second dummy word line DWL2 formed between the first drain select line DSL1 and the first word line group. Specific arrangements and extension directions of the isolation regions B, the active regions A, the first drain select line DSL1, the first source select line SSL1, the first word lines WL0 to WLn, and the first and second dummy word lines DWL1 and DWL2 are the same as described above with reference to FIGS. 2 and 3.

A second drain select line DSL2 of a second memory block may be disposed adjacent to the first drain select line DSL1, and a second source select line SSL2 of another second memory block may be disposed adjacent to the first source select line SSL1. The first memory blocks may be disposed between the second memory blocks.

Although not shown, each of the second memory blocks may include the second drain select line DSL2, the second source select line SSL2, and a second word line group disposed between the second drain select line DSL2 and the second source select line SSL2. The second word line group may include a plurality of second word lines.

Each of junction regions 201a interposed between the first and second drain select lines DSL1 and DSL2 may be defined as a drain region of a string structure ST, and each of the junction regions 201a interposed between the first and second source select lines SSL1 and SSL2 may be defined as a source region of the string structure ST.

The drain select lines DSL, the source select lines SSL, the first word lines WL0 to WLn, the first and second dummy word lines DWL1 and DWL2, and the junction regions 201a may be covered with at least one first interlayer insulating layer 221. The first interlayer insulating layer 221 may be formed of a low-k dielectric layer having a lower dielectric constant than a silicon oxide layer to reduce interference between the first block word line BLKWL formed on the first interlayer insulating layer 221 and the first word line group formed under the first interlayer insulating layer 221. More specifically, the first interlayer insulating layer 221 may be formed using a low-k dielectric layer having a dielectric constant of less than 4.0.

The first interlayer insulating layer 221 interposed between the first and second drain select lines DSL1 and DSL2 may be penetrated by drain contact plugs DCT1 and DCT2. The drain contact plugs DCT1 and DCT2 may include first drain contact plugs DCT1 and second drain contact plugs DCT2, which may be alternately disposed in a direction in which the first and second drain select lines DSL1 and DSL2 extend. The first and second drain contact plugs DCT1 and DCT2 may be connected to the junction regions 201a formed in the active regions A. Arrangements of the first and second drain contact plugs DCT1 and DCT2 may be the same as described above with reference to FIGS. 2 and 3. The first and second drain contact plugs DCT1 and DCT2 may protrude from the first interlayer insulating layer 221 and further penetrate second and third interlayer insulating layers 223 and 225 formed between the first interlayer insulating layer 221 and the bit line BL.

The first interlayer insulating layer 221 interposed between the first and second source select lines SSL1 and SSL2 may be penetrated by a source contact line SCT. The source contact line SCT may extend in the same direction as a direction in which the first and second source select lines SSL1 and SSL2 extend, and be connected in common to the junction regions 201a interposed between the first and second source select lines SSL1 and SSL2.

The second interlayer insulating layer 223 may be formed on the first interlayer insulating layer 221. The second interlayer insulating layer 223 may be penetrated by a common source line CSL and the first block word line BLKWL.

The common source line CSL may be formed to have a greater width than the source contact line SCT to penetrate the second interlayer insulating layer 223 disposed on the source contact line SCT. The common source line CSL may be formed as a mesh type to avoid overlaps with the first word lines WL0 to WLn, the first block word line BLKWL, and the first drain select line DSL1.

To minimize parasitic capacitance between the first block word line BLKWL and the first word lines WL0 to WLn, the first block word line BLKWL may be formed to avoid overlaps with the first word lines WL0 to WLn. Also, the first block word line BLKWL may be formed in a second edge region R2 of the first memory block, in which the first source select line SSL1 and the first dummy word line DWL1 are formed. More specifically, the first block word line BLKWL may be formed between the first source select line SSL1 and the first word line group, or between the first source select line SSL1 and the first dummy word line DWL1. A portion of the first block word line BLKWL may overlap the first source select line SSL1, or overlap the first dummy word line DWL1.

The third interlayer insulating layer 225 may be further formed on the second interlayer insulating layer 223, and bit lines BL may be formed on the third interlayer insulating layer 225. The bit lines BL may extend in the same direction as the active regions A and overlap the active regions A. Each of the bit lines BL may be connected to the string structure ST through the corresponding one of the drain contact plugs DCT1 and DCT2.

Since the method of manufacturing the semiconductor memory device according to the second embodiment is the same as the method of manufacturing the semiconductor memory device according to the first embodiment except for a region in which a block word line trench, a common source line trench, a common source line and the first block word line BLKWL are formed, a detailed description thereof is omitted.

Figure 6:
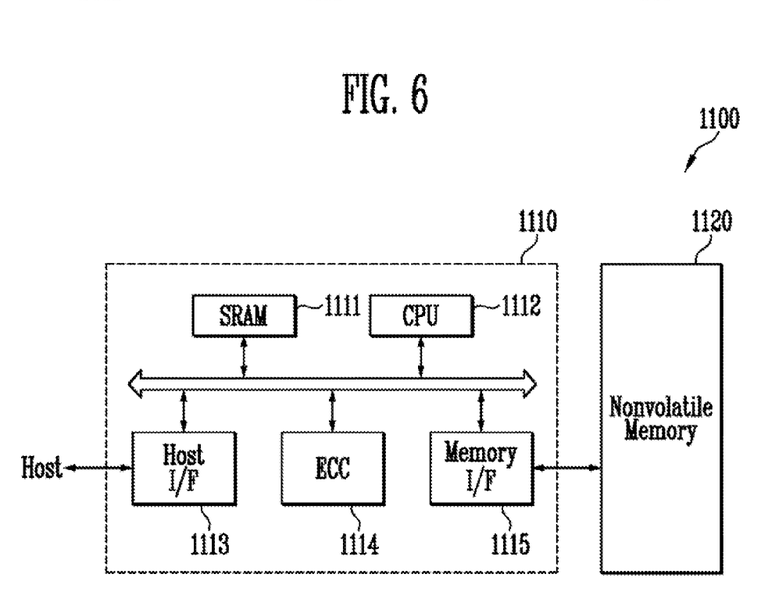
FIG. 6 is a configuration diagram illustrating a memory system according to an exemplary embodiment of the present invention.

FIG. 6 is a configuration diagram illustrating a memory system 1100 according to an exemplary embodiment of the present invention.

Referring to FIG. 6, the memory system 1100 according to the embodiment of the present invention may include a non-volatile memory device 1120 and a memory controller 1110.

The non-volatile memory device 1120 may include a non-volatile memory device described in the foregoing embodiments with reference to FIGS. 1 through 5. In addition, the non-volatile memory device 1120 may be a multi-chip package including a plurality of flash memory chips.

The memory controller 1110 may be configured to control the non-volatile memory device 1120, and include a static random access memory (SRAM) 1111, a central processing unit (CPU) 1112, a host interface 1113, an error correction code block (ECC) 1114, and a memory interface 1115. The SRAM 1111 may be used as an operation memory of the CPU 1112. The CPU 1112 may perform general control operations so that the memory controller 1110 may exchange data. The host interface 1113 may include a data exchange protocol of a host connected to the memory system 1100. In addition, the ECC 1114 may detect and correct errors included in data read from the non-volatile memory device 1120, and the memory interface 1115 may interface with the non-volatile memory device 1120. In addition, the memory controller 1110 may further include a read-only memory (ROM) configured to store code data required to interface with the host.

The memory system 1100 having the above-described configuration may be a memory card or solid-state disk (SSD) in which the non-volatile memory device 1120 is combined with the memory controller 1110. For example, when the memory system 1100 is an SSD, the memory controller 1110 may communicate with the outside (e.g., the host) through one of various interface protocols, such as a universal serial bus (USB), a man machine communication (MMC), a peripheral component interconnect-express (PCI-E), a serial advanced technology attachment (SATA), a parallel advanced technology attachment (DATA), a small computer system interface (SCSI), an enhanced small device interface (ESDI), or an intelligent drive electronics (IDE).

Figure 7:
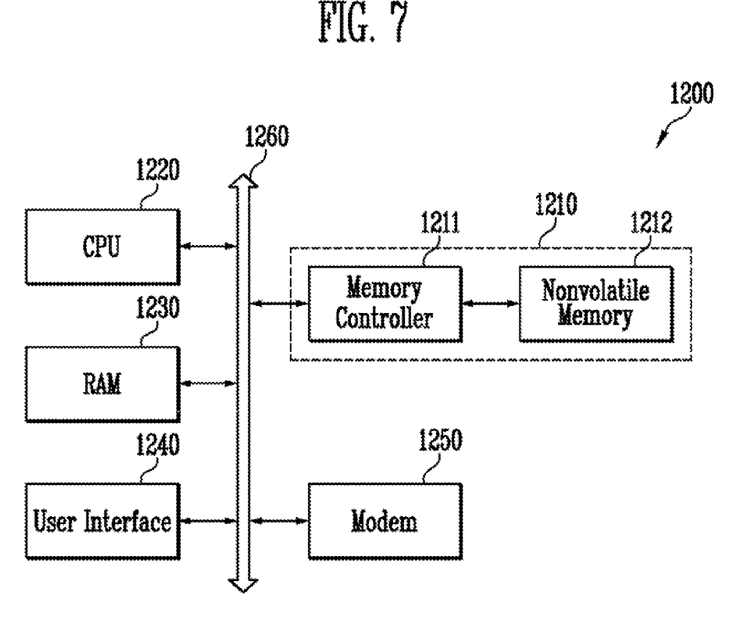
FIG. 7 is a configuration diagram illustrating computing system according to an exemplary embodiment of the present invention.

FIG. 7 is a configuration diagram illustrating a computing system 1200 according to an exemplary embodiment of the present invention.

Referring to FIG. 7, the computing system 1200 according to the exemplary embodiment of the present invention may include a CPU 1220, a RAM 1230, a user interface 1240, a modem 1250, and a memory system 1210, which may be connected to a system bus 1260. Also, when the computing system 1200 is a mobile device, the computing system 1200 may include a battery configured to supply an operating voltage to the computing system 1200, and further include an application chipset, a camera image processor (CIS), and/or a mobile dynamic RAM (DRAM).

As described with reference to FIG. 6, the memory system 1210 may include a non-volatile memory 1212 and a memory controller 1211.

According to the present invention, a switching group disposed opposite a block decoder across a memory block may be connected to a block word line disposed in a region in which the memory block is formed. Thus, even if the block decoder is not disposed adjacent to the switching group, the block decoder may be connected to the switching group through the block word line disposed in the region in which the memory block is formed. As a result, the number of block decoders may not be increased according to the disposition of the switching group, thereby improving the integration density of semiconductor memory devices.

In addition, the embodiments of the present invention may prevent the block word line disposed in the region in which the memory block is formed from overlapping word lines so that interference between the block word line and the word lines may be reduced to improve performance of semiconductor memory devices.

In the drawings and specification, typical exemplary embodiments of the invention have been disclosed. Although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor memory device comprising:
a block decoder configured to output block selection signals for selecting memory blocks in response to a row address signal;
a first memory block including a first drain select line, a first source select line, and a first word line group including a plurality of first word lines disposed between the first drain select line and the first source select line, the first memory block disposed between the block decoder and a first switching group;
the first switching group configured to transmit first operating voltages to the first memory block in response to a first block selection signal among the block selection signals; and
a first block word line configured to transmit the first block selection signal to the first switching group and disposed over the first memory block to avoid overlapping with the first word line group,
wherein the first block word line is disposed between the first drain select line and the first word line group or between the first source select line and the first word line group.

2. The device of claim 1, wherein the first block word line is disposed on an edge region of the first memory block.

3. A semiconductor memory device comprising:
a block decoder configured to output block selection signals for selecting memory blocks in response to a row address signal:
a first memory block including a first drain select line, a first source select line, and a first word line group including a plurality of first word lines disposed between the first drain select line and the first source select line, the first memory block disposed between the block decoder and a first switching group:
the first switching group configured to transmit first operating voltages to the first memory block in response to a first block selection signal among the block selection signals: and
a first block word line configured to transmit the first block selection signal to the first switching group and disposed over the first memory block to avoid overlapping with the first word line group,
wherein the first memory block further comprises a first dummy word line disposed between the first source select line and the first word line group, and a second dummy word line disposed between the first drain select line and the first word line group,
wherein the first block word line is disposed between the second dummy word line and the first drain select line or between the first dummy word line and the first source select line.

4. The device of claim 1, further comprising an interlayer insulating layer having at least one layer and covering the first drain select line, the first source select line, and the first word line group.

5. The device of claim 4, wherein the first block word line is formed over the interlayer insulating layer.

6. The device of claim 4, wherein the interlayer insulating layer comprises a low-k dielectric layer having a dielectric constant of less than 4.0.

7. The device of claim 1, further comprising:
a second memory block including a second drain select line, a second source select line, and a second word line group including a plurality of second word lines disposed between the second drain select line and the second source select line, the second memory block disposed adjacent to the first memory block;
a second switching group disposed between the second memory block and the block decoder, and configured to transmit second operating voltages to the second memory block in response to a second block selection signal among the block selection signals; and
a second block word line configured to transmit the second block selection signal to the second switching group.

8. The device of claim 7, further comprising:
a second global line decoder configured to output the second operating voltages; and
a second global line group configured to transmit the second operating voltages output from the second global line decoder to the second switching group.

9. A method of manufacturing a semiconductor memory device, comprising:
forming a drain select line, a source select line, and a word line group on a semiconductor substrate, the word line group including a plurality of word lines disposed between the drain select line and the source select line;
forming a first interlayer insulating layer to cover the word line group; and forming a block word line over the first interlayer insulating layer to avoid overlap with the word line group,
wherein the block word line is disposed between the drain select line and the word line group or between the source select line and the word line group.

10. A method of manufacturing a semiconductor memory device, comprising:
forming a drain select line, a source select line, and a word line group on a semiconductor substrate, the word line group including a plurality of word lines disposed between the drain select line and the source select line;
forming a first dummy word line disposed between the source select line and the word line group, and a second dummy word line disposed between the drain select line and the word line group:
forming a first interlayer insulating layer to cover the word line group: and
forming a block word line over the first interlayer insulating layer to avoid overlap with the word line group,
wherein the block word line is disposed between the first dummy word line and the source select line or between the second dummy word line and the drain selection line.

11. The method of claim 10, wherein a portion of the block word line is disposed to overlap the drain select line or the second dummy word line.

12. The method of claim 10, wherein a portion of the block word line is disposed to overlap the source select line or the first dummy word line.

* * * * *